United States Patent
Sugi et al.

(10) Patent No.: US 8,902,383 B2
(45) Date of Patent: Dec. 2, 2014

(54) ORGANIC ELECTROLUMINESCENT DEVICE, LIGHTING APPARATUS, AND METHOD FOR MANUFACTURING THE ORGANIC ELECTROLUMINESCENT DEVICE

(71) Applicants: Keiji Sugi, Kanagawa-ken (JP); Shintaro Enomoto, Kanagawa-ken (JP); Tomio Ono, Kanagawa-ken (JP); Tomoaki Sawabe, Tokyo (JP); Yasushi Shinjo, Kanagawa-ken (JP); Yukitami Mizuno, Tokyo (JP); Akio Amano, Tokyo (JP); Tomoko Sugizaki, Kanagawa-ken (JP); Toshiya Yonehara, Kanagawa-ken (JP); Daimotsu Kato, Tokyo (JP)

(72) Inventors: Keiji Sugi, Kanagawa-ken (JP); Shintaro Enomoto, Kanagawa-ken (JP); Tomio Ono, Kanagawa-ken (JP); Tomoaki Sawabe, Tokyo (JP); Yasushi Shinjo, Kanagawa-ken (JP); Yukitami Mizuno, Tokyo (JP); Akio Amano, Tokyo (JP); Tomoko Sugizaki, Kanagawa-ken (JP); Toshiya Yonehara, Kanagawa-ken (JP); Daimotsu Kato, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 150 days.

(21) Appl. No.: 13/721,707

(22) Filed: Dec. 20, 2012

(65) Prior Publication Data
US 2013/0250214 A1    Sep. 26, 2013

(30) Foreign Application Priority Data
Mar. 23, 2012    (JP) .................................. 2012-068310

(51) Int. Cl.
| | | |
|---|---|---|
| G02F 1/1335 | (2006.01) | |
| F21V 7/04 | (2006.01) | |
| H01L 51/52 | (2006.01) | |
| H01L 27/32 | (2006.01) | |

(52) U.S. Cl.
CPC ........ H01L 51/5203 (2013.01); *G02F 2201/44* (2013.01); H01L 27/3232 (2013.01)
USPC ................................ 349/69; 349/61; 362/611

(58) Field of Classification Search
CPC .................... G02F 1/133603; G02F 1/133615; G02F 2001/133607; G02F 1/133621; G02F 1/133604; G02B 6/0068; G02B 6/0038; G02B 6/0055; G02B 6/0021
USPC ....................................... 349/69, 61; 362/611
See application file for complete search history.

(56) References Cited

U.S. PATENT DOCUMENTS

| | | | |
|---|---|---|---|
| 2003/0214227 A1* | 11/2003 | Tsuchiya | 313/504 |
| 2005/0142379 A1 | 6/2005 | Juni et al. | |
| 2007/0052345 A1* | 3/2007 | Wano | 313/504 |
| 2007/0126967 A1 | 6/2007 | Choi et al. | |
| 2008/0258154 A1* | 10/2008 | Arai | 257/79 |
| 2009/0033596 A1 | 2/2009 | Yoon et al. | |
| 2010/0231825 A1 | 9/2010 | Koma et al. | |
| 2012/0032175 A1 | 2/2012 | Wang et al. | |
| 2013/0248825 A1* | 9/2013 | Sugizaki et al. | 257/40 |

FOREIGN PATENT DOCUMENTS

| | | |
|---|---|---|
| EP | 1 548 856 A2 | 6/2005 |
| EP | 1 548 856 A3 | 6/2005 |
| EP | 2 023 396 A1 | 2/2009 |
| JP | 2-67316 U | 5/1990 |
| JP | 10-125461 A | 5/1998 |
| JP | 2003-257621 A | 9/2003 |
| JP | 2003-272853 A | 9/2003 |
| JP | 2004-363040 | 12/2004 |
| JP | 2006-234963 A | 9/2006 |
| JP | 2010-212169 A | 9/2010 |

OTHER PUBLICATIONS

Office Action issued Apr. 15, 2014 in Japanese Patent Application No. 2012-068310 (with English language translation).

(56) References Cited

OTHER PUBLICATIONS

Extended European Search Report issued Jul. 10, 2013, in European Patent Application No. 13152671.7.
U.S. Appl. No. 14/045,133, filed Oct. 3, 2013, Ono, et al.
U.S. Appl. No. 14/077,644, filed Nov. 12, 2013, Sawabe, et al.
Japanese Office Action issued Sep. 1, 2014, in counterpart Japanese Patent Application No. 2012-068310 (w/English Translation).

* cited by examiner

*Primary Examiner* — Mike Qi

(74) *Attorney, Agent, or Firm* — Oblon, Spivak, McClelland, Maier & Neustadt, L.L.P.

(57) ABSTRACT

According to one embodiment, an organic electroluminescent device includes a first electrode, a second electrode, an organic light emitting layer and an optical layer. The first electrode has a first major surface and a second major surface opposite to the first major surface and is light transmissive. The second electrode faces a portion of the first major surface. The organic light emitting layer is provided between the first electrode and the second electrode. The organic light emitting layer and the first electrode are disposed between the optical layer and the second electrode. The optical layer is able to transit between a first state where a traveling direction of light emitted from the organic light emitting layer is changed and a second state having a smaller degree of the change in the traveling direction of the light than the first state.

20 Claims, 13 Drawing Sheets

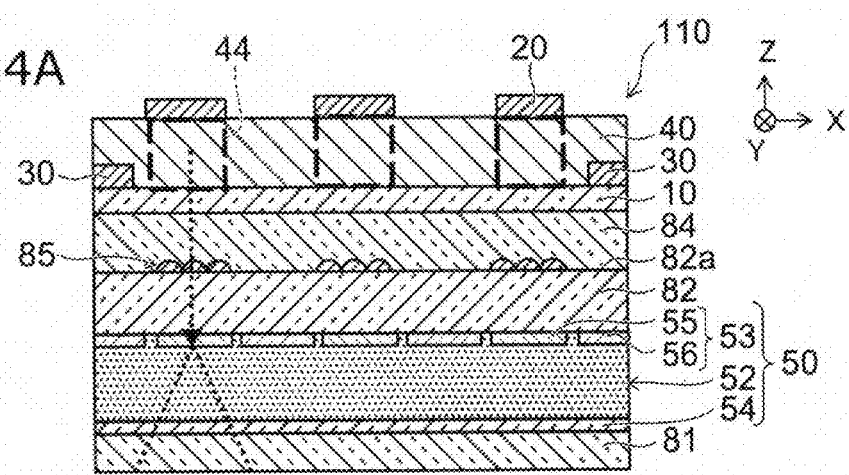
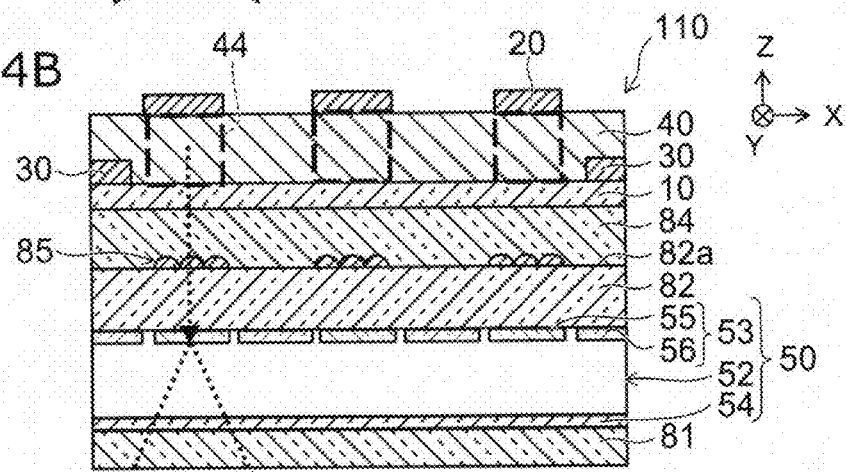
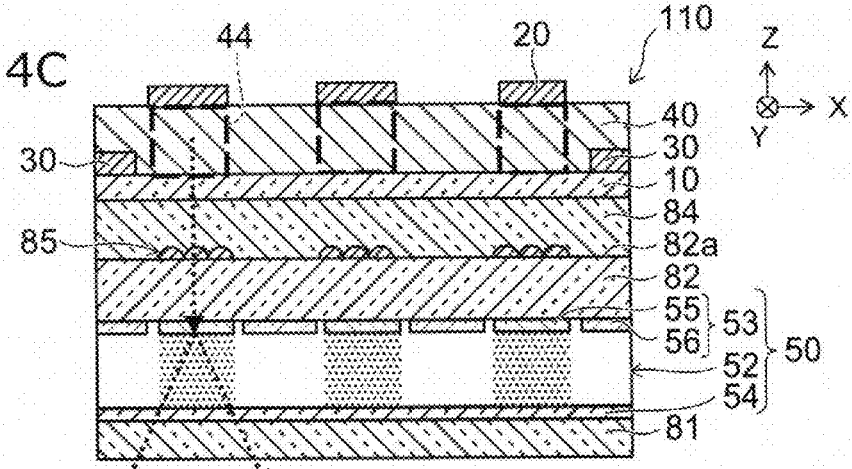

ORGANIC ELECTROLUMINESCENT DEVICE, LIGHTING APPARATUS, AND METHOD FOR MANUFACTURING THE ORGANIC ELECTROLUMINESCENT DEVICE

CROSS-REFERENCE TO RELATED APPLICATIONS

This application is based upon and claims the benefit of priority from the prior Japanese Patent Application No. 2012-068310, filed on Mar. 23, 2012; the entire contents of which are incorporated herein by reference.

FIELD

Embodiments described herein relate generally to an organic electroluminescent device, a lighting apparatus, and a method for manufacturing the organic electroluminescent device.

BACKGROUND

Recently, organic electroluminescent devices have been attracting attentions for use as a flat surface light source. In the organic electroluminescent device, an organic thin film is provided between two electrodes. By applying a voltage on the organic thin film to inject electrons and holes so that they may be recombined, excitons are produced. When the excitons are radiatively deactivated, light is emitted and utilized.

Due to their features such as thinness, light weight, and surface emission, the organic electroluminescent devices are expected to find applications that have not been able to be realized with the conventional lighting apparatuses and light sources.

BRIEF DESCRIPTION OF THE DRAWINGS

FIG. 4A to FIG. 4C are schematic cross-sectional views illustrating optical characteristics of a portion of the organic electroluminescent device according to the first embodiment;

DETAILED DESCRIPTION

Figure 1:
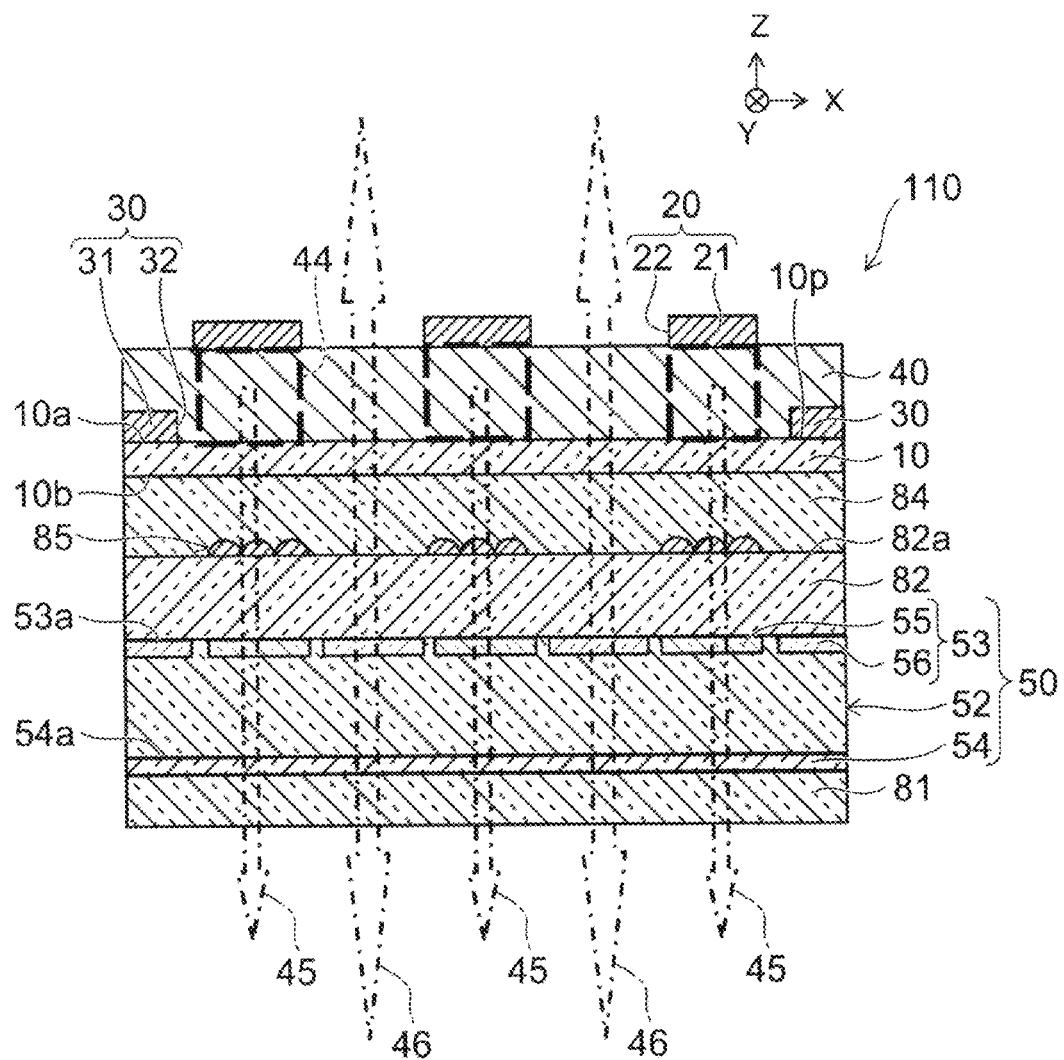
FIG. 1 is a schematic cross-sectional view illustrating the configuration of an organic electroluminescent device according to a first embodiment.

According to one embodiment, an organic electroluminescent device includes a first electrode, a second electrode, an organic light emitting layer and an optical layer. The first electrode has a first major surface and a second major surface opposite to the first major surface and is light transmissive. The second electrode faces a portion of the first major surface. The organic light emitting layer is provided between the first electrode and the second electrode. The organic light emitting layer and the first electrode are disposed between the optical layer and the second electrode. The optical layer is able to transit between a first state where a traveling direction of light emitted from the organic light emitting layer is changed and a second state having a smaller degree of the change in the traveling direction of the light than the first state.

According to another embodiment, a lighting apparatus includes an organic electroluminescent device and a power supply unit. The organic electroluminescent device includes a first electrode having a first major surface and a second major surface opposite to the first major surface and being light transmissive, a second electrode facing a portion of the first major surface, an organic light emitting layer provided between the first electrode and the second electrode and an optical layer facing the second major surface and being able to transit between a first state where a traveling direction of light emitted from the organic light emitting layer is changed and a second state having a smaller degree of the change in the traveling direction of the light than the first state. The power supply unit is electrically connected to the first electrode and the second electrode to supply a current to the organic light emitting layer via the first electrode and the second electrode.

According to another embodiment, a method is disclosed for manufacturing an organic electroluminescent device. The method can include preparing a workpiece including a first electrode having a first major surface and a second major surface opposite to the first major surface and being light transmissive, a second electrode facing a portion of the first major surface, and an organic light emitting layer provided between the first electrode and the second electrode. The method can include forming an optical layer on a surface of the workpiece on a side of the second major surface, the optical layer being able to transit between a first state where a traveling direction of light emitted from the organic light emitting layer is changed and a second state having a smaller degree of the change in the traveling direction of the light than the first state.

Various embodiments will be described hereinafter with reference to the accompanying drawings.

The drawings are schematic or conceptual, so that the relationship between thickness and width of each of the components and the size ratio between the components are not always realistic. Even the same component may be denoted with different sizes or ratios in the different drawings.

In the specification and the drawings, identical reference numerals are given to identical components in examples, and detailed description on the identical components will be omitted appropriately.

(First Embodiment)

FIG. 1 is a schematic cross-sectional view illustrating the configuration of an organic electroluminescent device according to a first embodiment.

Figure 2:
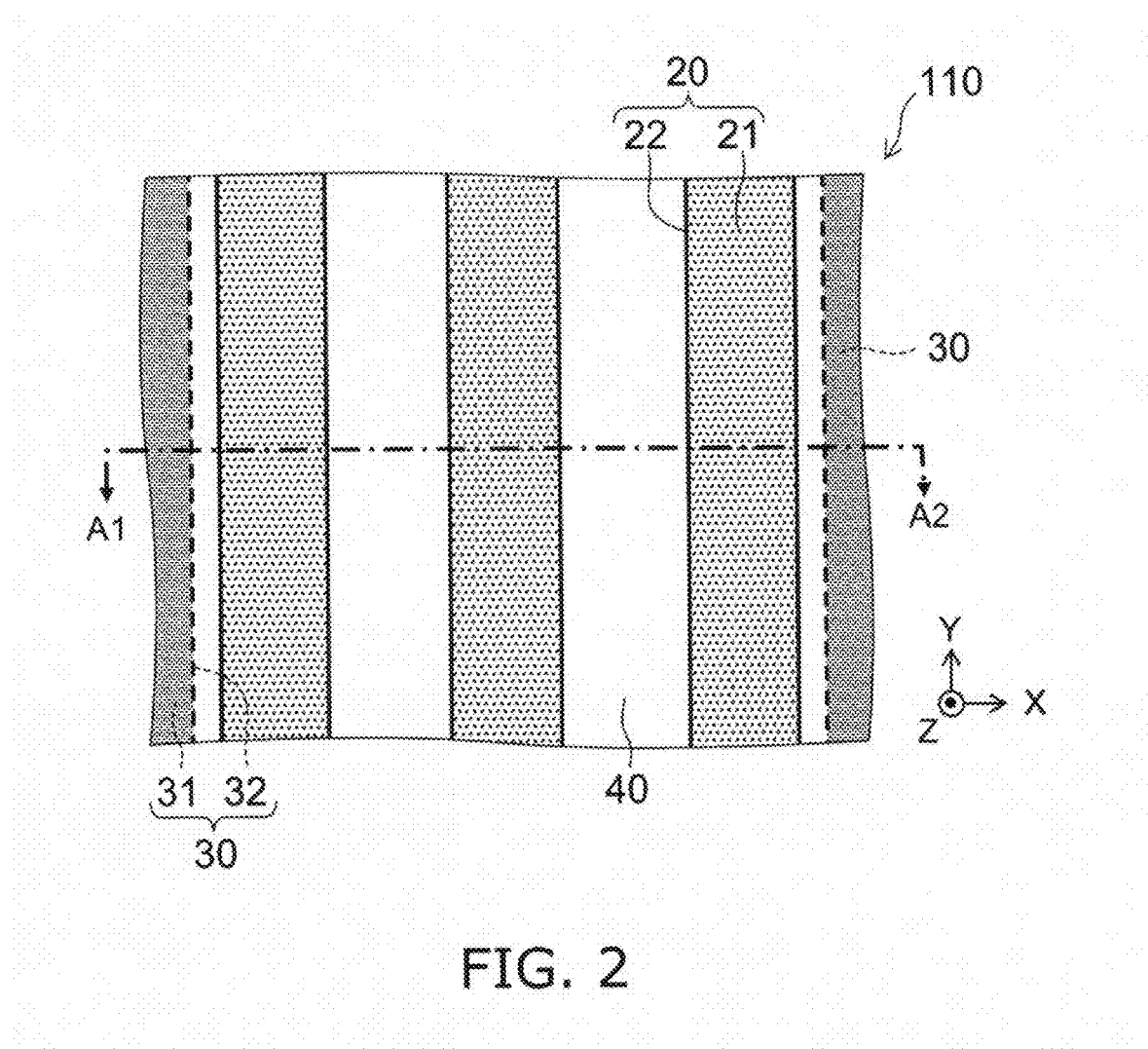
FIG. 2 is a schematic plan view illustrating the configuration of the organic electroluminescent device according to the first embodiment.

FIG. 2 is a schematic plan view illustrating the configuration of the organic electroluminescent device according to the first embodiment. FIG. 1 is a cross-sectional view taken along line A1-A2 of FIG. 2.

Those figures illustrate the organic electroluminescent device according to the embodiment by expanding a portion of this device.

As shown in FIG. 1 and FIG. 2, an organic electroluminescent device 110 includes a first electrode 10, a second electrode 20, an organic light emitting layer 40, and an optical layer 50.

The first electrode 10 has a first major surface 10a and a second major surface 10b. The second major surface 10b is opposite the first major surface 10a. The first electrode 10 is light transmissive. The first electrode 10 may be, for example, a transparent electrode.

In this example, a first direction perpendicular to the first major surface 10a is taken to be a Z-axis direction. One direction parallel to the first major surface 10a is taken to be an X-axis direction. A direction parallel to the first major surface 10a and perpendicular to the X-axis direction is taken to be a Y-axis direction. The X-axis and Y-axis directions are perpendicular to the Z-axis direction. The Z-axis direction corresponds to the thickness direction of the first electrode 10.

The second electrode 20 faces a portion of the first major surface 10a of the first electrode 10. The second electrode 20 is light reflective. The second electrode 20 has a higher optical reflectivity than the first electrode 10. The second electrode 20 has a conductive portion 21 and an opening 22. The conductive portion 21 is light reflective. The conductive portion 21 is provided except at the opening 22. The second electrode 20 has, for example, a plurality of the openings 22. In a region other than the openings 22, the conductive portion 21 is provided. The second electrode 20 faces the first major surface 10a at the conductive portion 21. In the specification of the application, a state to "face" includes not only a state to face directly but also a state to face indirectly via another component inserted. In the specification of the application, a state to "be provided on" includes not only a state to be provided directly on something but also a state to be provided on something with another component inserted between them. "A state to be "stacked" includes not only a state to be stacked directly on something but also a state to be stacked on something with another component inserted between them.

As shown in FIG. 2, the conductive portion 21 is shaped like a belt which extends along the Y-axis direction. A plurality of the conductive portions 21 are provided side by side along the X-axis direction, for example. Accordingly, the second electrode 20 is formed like a striped-pattern shape. The spacing between the plurality of conductive portions 21 is constant, for example. The pattern shape of the second electrode 20 is arbitrary.

The organic light emitting layer 40 is provided between the first major surface 10a of the first electrode 10 and the second electrode 20. For example, if supplied with a voltage via the first electrode 10 and the second electrode 20, the organic light emitting layer 40 recombines electrons and holes to generate excitons. The organic light emitting layer 40 produces luminescence by utilizing light which is emitted when the excitons are radiatively deactivated, for example.

The organic electroluminescent device 110 further includes an interconnection layer 30, a first substrate 81, a second substrate 82, and a high-refractive index layer 84. The interconnection layer 30, the first substrate 81, the second substrate 82, and the high-refractive index layer 84 are each provided to the organic electroluminescent device 110 appropriately and can be omitted.

The first substrate 81 and the second substrate 82 are light transmissive. The refractive index of the first substrate 81 is, for example, not less than 1.4 and not more than 1.9. The refractive index of the second substrate 82 is, for example, not less than 1.4 and not more than 1.9.

The optical layer 50 is provided between the first substrate 81 and the second substrate 82. The organic light emitting layer 40 and the first electrode 10 are disposed between the optical layer 50 and the second electrode 20. The high-refractive index layer 84 is provided between the first electrode 10 and the second electrode 82. That is, the high-refractive index layer 84 is provided between the first electrode 10 and the optical layer 50. In this example, the optical layer 50 is provided on the first substrate 81. The second substrate 82 is provided on the optical layer 50. The high-refractive index layer 84 is provided on the second substrate 82. The first electrode 10 is provided on the high-refractive index layer 84. The organic light emitting layer 40 is provided on the first electrode 10. Then, the second electrode 20 is provided on the organic light emitting layer 40.

The high-refractive index layer 84 has substantially the same refractive index as that of the first electrode 10. The first electrode 10 has substantially the same refractive index as that of the organic light emitting layer 40. That is, the refractive index of the high-refractive index layer 84 is substantially the same as that of the organic light emitting layer 40. By thus making the refractive index of the high-refractive index layer 84 match those of the first electrode 10 and the organic light emitting layer 40, the extraction efficiency of light emitted from the organic light emitting layer 40 can be improved. That is, the luminous efficiency of the organic electroluminescent device 110 improves. The refractive index of the organic light emitting layer 40 is, for example, not less than 1.6 and not more than 2.0.

An irregular portion 85 is provided on a major surface 82a of the second substrate 82 which is a junction interface between the second substrate 82 and the high-refractive index layer 84. A plurality of the irregular portions 85 are provided, for example, on the major surface 82a. That is, the irregular portions 85 are provided between the optical layer 50 and the high-refractive index layer 84. The plurality of irregular portions 85 are disposed to, for example, a position where they overlap with the second electrode 20 when projected to a plane (X-Y plane) parallel to the first major surface 10a (when viewed in the Z-axis direction). The plurality of irregular portions 85 may be, for example, pyramid-shaped. The pyramid-shaped irregular portions 85 can be formed by, for example, performing frost processing on the major surface 82a. The plurality of irregular portions 85 change the direction in which light emitted from, for example, the organic light emitting layer 40 travels. The plurality of irregular portions 85, for example, scatter light. In such a manner, the plurality of irregular portions 85 inhibit total reflection of light emitting from the organic light emitting layer 40 by the major surface 82a.

The interconnection layer 30 extends along a plane parallel to the first major surface 10a. That is, the interconnection layer 30 extends in the X-Y plane. In this example, the interconnection layer 30 is provided on the first major surface 10a of the first electrode 10. That is, the interconnection layer 30 is provided between the first electrode 10 and the organic light emitting layer 40. The interconnection layer 30 is disposed to a portion 10p of a portion of the first major surface 10a that does not overlap with the second electrode 20 when projected to the X-Y plane. The portion that does not overlap with the second electrode 20 is a portion between the two neighboring conductive portions 21 when projected to the X-Y plane. That is, the portion that does not overlap with the second electrode 20 is a portion of the first major surface 10a that overlaps with the opening 22 when projected to the X-Y plane. The interconnection layer 30 may be provided on the second major surface 10b of the first electrode 10. In this case, the interconnection layer 30 is provided to one portion of a portion of the second major surface 10b that does not overlap with the second electrode 20 when projected to the X-Y plane. The first electrode 10 has a portion that does not overlap with the interconnection layer 30 when projected to the X-Y plane.

The interconnection layer 30 has, for example, a conductive interconnection portion 31 and an opening 32. The interconnection portion 31 is provided except at the opening 32. The opening 32 overlaps at least a portion of the first electrode when projected to the X-Y plane. For example, the interconnection portion 31 overlaps with a portion of the first electrode 10 when projected to the X-Y plane. The interconnection layer 30 is electrically connected to the first electrode 10. The interconnection layer 30 extends, for example, in the X-Y plane. The pattern of the interconnection layer 30 is, for example, stripe-shaped or lattice-shaped.

As shown in FIG. 2, in this example, the interconnection portion 31 is shaped like a belt extending along the Y-axis direction. A plurality of the interconnection portion 31 are provided side by side along, for example, the X-axis direction. Thus, the interconnection layer 30 is formed like a stripe-shaped pattern. The distance between the plurality of interconnection portions 31 is, for example, constant. Further, the distance between the plurality of interconnection portions 31 is, for example, larger than that between the plurality of conductive portions 21. In this example, for example, one of the interconnection portions 31 is provided for each three of the conductive portions 21. The pattern shape of the interconnection layer 30 is arbitrary.

The conductivity of the interconnection layer 30 is higher than that of the first electrode 10. The interconnection layer 30 is light reflective. The interconnection layer 30 may be, for example, a metal interconnection. The interconnection layer 30 functions as, for example, an auxiliary electrode that transmits a current flowing through the first electrode 10. The interconnection layer 30 exposes at least a portion of the first electrode 10.

The optical reflectivity of the interconnection layer 30 is higher than that of the first electrode 10. In the specification of the application, the state of having an optical reflectivity than that of the first electrode 10 is referred to as being light reflective. An insulating layer (not shown) may be provided on the upper surface and the side surface of the interconnection layer 30.

The optical transmittance of the first electrode 10 is higher than those of the interconnection layer 30 and the second electrode 20. In the specification of the application, the state of having a higher optical transmittance than those of the interconnection layer 30 and the second electrode 20 is referred to as being light transmissive. For example, the optical transmittance of the first substrate 81 is higher than those of the second electrode 20 and the interconnection layer 30. The optical transmittance of the second substrate 82 is higher than those of the second electrode 20 and the interconnection layer 30.

The optical layer 50 includes a third electrode 53 having a third major surface 53a parallel to the second major surface 10b of the first electrode 10, a fourth electrode 54 having a fourth major surface 54a parallel to the third major surface 53a, and a liquid crystal layer 52 provided between the third electrode 53 and the fourth electrode 54. The third electrode 53 and the fourth electrode 54 are light transmissive. The third electrode 53 and the fourth electrode 54 each are, for example, a transparent electrode.

The third electrode 53 includes a facing portion 55 that is provided to a portion which overlaps with the second electrode 20 when projected to the X-Y plane and a non-facing portion 56 that is provided separately from the facing portion 55 to a portion which does not overlap with the second electrode 20 when projected to the X-Y plane. The pattern shape of the facing portion 55 is substantially the same as that of the second electrode 20. That is, the pattern of the facing portion 55 is stripe-shaped.

Figure 3A:
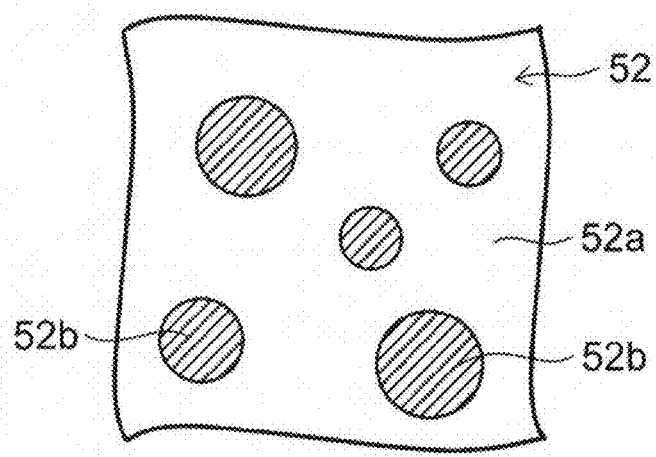
FIG. 3A to FIG. 3C are schematic views illustrating the configuration of a portion of the organic electroluminescent device according to the first embodiment.
Figure 3B:
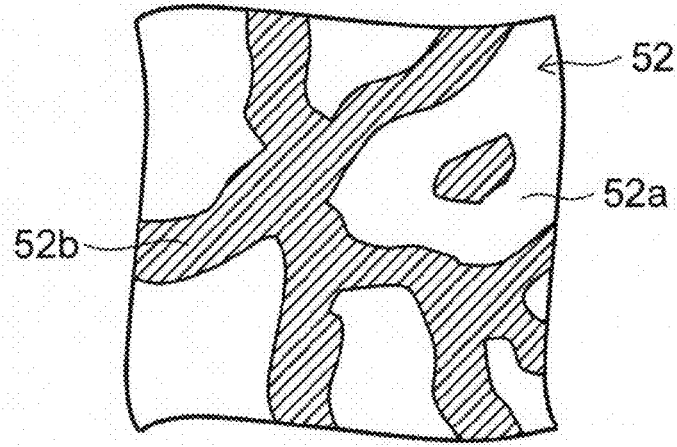
Figure 3C:
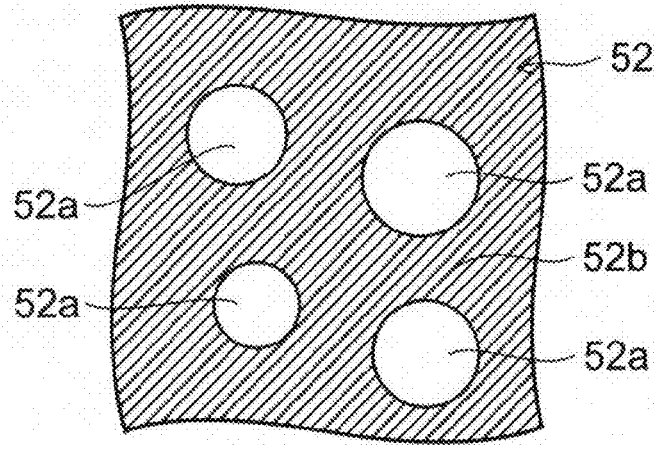

FIG. 3A to FIG. 3C are schematic views illustrating the configuration of a portion of the organic electroluminescent device according to the first embodiment.

FIG. 3A to FIG. 3C show the liquid crystal layer 52 by expanding its portion.

As shown in FIG. 3A, the liquid crystal layer 52 includes, for example, a resin portion 52a and a liquid crystal portion 52b. In the liquid crystal layer 52, for example, a liquid crystal type referred to as polymer-dispersed liquid crystal (PDLC) is employed.

The resin portion 52a is light transmissive. As the material of the resin portion 52a, for example, a film-shaped porous body or the like may be used. The refractive index of the resin portion 52a is substantially the same as those of the first substrate 81 and the second substrate 82. The refractive index of the resin portion 52a is, for example, not less than 1.4 and not more than 1.8. The resin portion 52a is made of, for example, a transparent material which hardens with heat or ultraviolet light.

The liquid crystal portion 52b is made of, for example, nematic liquid crystal. In this example, the liquid crystal portion 52b is shaped like a liquid droplet.

As shown in FIG. 3B, the liquid crystal portion 52b may be of, for example, an irregular shape like a net. The liquid crystal layer 52 may be of a liquid crystal type referred to as polymer network liquid crystal.

As shown in FIG. 3C, in the liquid crystal layer 52, the resin portions 52b are dispersed in the liquid crystal portion 52b.

FIG. 4A to FIG. 4C are schematic cross-sectional views illustrating optical characteristics of a portion of the organic electroluminescent device according to the first embodiment.

FIG. 4A to FIG. 4C illustrate the optical characteristics of the optical layer 50.

As shown in FIG. 4A, the optical layer 50 has a first state in which it changes the direction in which passing light (light emitted from the organic light emitting layer 30) travels. The optical layer 50 in the first state, for example, disperses the incident light in the liquid crystal layer 52. A change in light traveling direction may be based on the refraction effect. Further, it may be based on the diffraction effect. The optical layer 50 as which the liquid crystal layer 52 having the configuration shown in any one of FIG. 3A to FIG. 3C enters the first state if the absolute value (which may be effective value)

of a difference in voltage between the third electrode 53 and the fourth electrode 54 is the small value of a first voltage. The first voltage includes 0 volt.

As shown in FIG. 4B, the optical layer 50 has a second state whose degree of a change in the traveling direction of the passing light is lower than that of the first state. The optical layer 50 in the second state does not change, for example, the passing light's traveling direction substantially. The optical layer 50 in the second state is, for example, transparent. In other words, the dispersion ratio of the optical layer 50 in the second state is lower than that of the optical layer 50 in the first state. The optical layer 50 enters the second state if a voltage is applied between the third electrode 53 and the fourth electrode 54 so that the absolute value (which may be an effective value) of the difference in voltage between the third electrode 53 and the fourth electrode 54 may be a large value of a second voltage. The absolute value (effective value) of the second voltage is higher than that of the first voltage. In such a manner, the optical layer 50 can transit between the first and second states. Between the first and second states, the optical characteristics of the liquid crystal layer 52 change.

As shown in FIG. 4C, by applying a voltage only to the non-facing portion 56 of the third electrode 53, the optical layer 50 can selectively change the optical characteristics of a portion of the liquid crystal layer 52 that does not overlap with the second electrode 20 when projected to the X-Y plane from the first state to the second state. Conversely, by applying a voltage only to the facing portion 55 of the third electrode 53, the optical layer 50 can selectively change the optical characteristics of a portion of the liquid crystal layer 52 that overlaps with the second electrode 20 when projected to the X-Y plane from the first state to the second state.

From this, a state (state shown in FIG. 4C) where the optical characteristics of the portion of the liquid crystal layer 52 that does not overlap with the second electrode 20 when projected to the X-Y plane are in the second state and the optical characteristics of the portion of the liquid crystal layer 52 that overlaps with the second electrode 20 when projected to the X-Y plane are in the first state is referred to as a third state.

The organic light emitting layer 40 at a portion of the organic electroluminescent device 110 where the first electrode 10 and the second electrode 20 (conductive portion 21) face each other provides a light emitting region 44. Emitted light 45 emitted from the light emitting region 44 goes out of the organic electroluminescent device 110 via the first electrode 10, the high-refractive index layer 84, the irregular portion 85, the second substrate 82, the optical layer 50, and the first substrate 81. A portion of the emitted light 45 is reflected by the second electrode 20 and goes out via the first electrode 10, the high-refractive index layer 84, the irregular portion 85, the second substrate 82, the optical layer 50, and the first substrate 81.

For example, when permitting the organic light emitting layer 40 to emit light, the optical layer 50 is put in the first state. In such a manner, when the emitted light 45 is passing through the optical layer 50, the pathway of the emitted light 45 is changed by the liquid crystal layer 52. Thereby, light that may return into the organic electroluminescent device 110 by, for example, total reflection is reduced to improve the light extraction efficiency. That is, the luminous efficiency of the organic electroluminescent device 110 is improved.

In the organic electroluminescent device 110, external light 46 incoming from the outside passes through the opening 22 in the second electrode 20, the organic light emitting layer 40, the opening 32 in the interconnection layer 30, the first electrode 10, the high-refractive index layer 84, the second substrate 82, the optical layer 50, and the first substrate 81. In such a manner, the organic electroluminescent device 110 transmits the external light 46 incident upon the organic electroluminescent device 110 from the outside while letting the emitted light 45 go out. In this way, the organic electroluminescent device 110 is light transmissive.

For example, when not causing the organic light emitting layer 40 to emit light, the optical layer 50 is put in the second state. If the optical layer 50 is in the second state, the organic electroluminescent device 110 is, for example, transparent. Therefore, the external light 46 passing through the organic electroluminescent device 110 is not scattered substantially. If the optical layer 50 is in the second state, in the organic electroluminescent device 110, a background image can be visually recognized via the organic electroluminescent device 110. That is, the organic electroluminescent device 110 is a see-through thin film- or plate-shaped light source.

If an external image is specularly reflected by the conductive portion 21 and the interconnection portion 31, for example, an image of the observer himself is reflected by the conductive portion 21 and the interconnection portion 31 and the reflected image may be visually recognized by the observer. That is, a reflected image of the external image occurs. Therefore, it may significantly deteriorates the visibility of the background image.

To solve this problem for example, if the reflected image has a large influence, the optical layer 50 is put in the third state. In a case where the optical layer 50 is in the third state, in the organic electroluminescent device 110, the liquid crystal layer 52 is in the first state at a position where the light-reflective conductive portion 21 and the interconnection portion 31 overlap when projected to the X-Y plane. Therefore, the light specularly reflected by the conductive portion 21 and the interconnection layer 31 is scattered by the liquid crystal layer 52. Accordingly, the reflected image of the external image is inhibited from being visually recognized.

In a case where the optical layer 50 is put in the third state, in the organic electroluminescent device 110, the liquid crystal layer 52 is in the second state at a portion where the light-reflective conductive portion 21 and the interconnection layer 31 do not overlap when projected to the X-Y plane. Accordingly, the external light 46 is inhibited from being scattered to maintain the transparency of the organic electroluminescent device 110.

In such a manner, the organic electroluminescent device 110 of the embodiment can provide a light transmissive organic electroluminescent device. The organic electroluminescent device 110 has high luminous efficiency and high transparency. If applied to a lighting apparatus, the organic electroluminescent device 110 enables new various applications by its lighting functions as well as function to transmit background images.

Although the embodiment has set the absolute value of the second voltage higher than that of the first voltage, the absolute value of the second voltage may be set lower than that of the first voltage.

Figure 5:
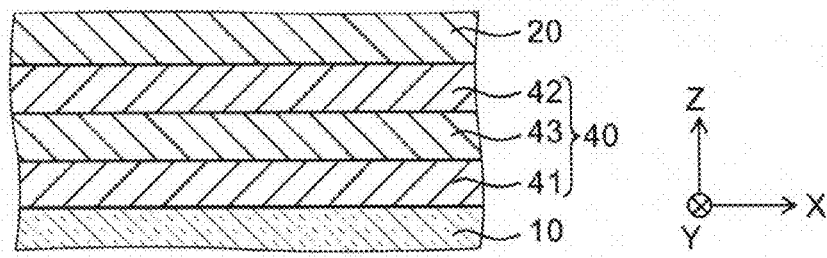
FIG. 5 is a schematic cross-sectional view illustrating the configuration of a portion of the organic electroluminescent device according to the first embodiment.

FIG. 5 is a schematic cross-sectional view illustrating the configuration of a portion of the organic electroluminescent device according to the first embodiment.

As shown in FIG. 5, the organic light emitting layer 40 includes a light emitting portion 43. The organic light emitting layer 40 can further include at least one of a first layer 41 and a second layer 42 as necessary. The light emitting portion 43 emits light including the wavelength of visible light. The first layer 41 is provided between the light emitting portion 43 and the first electrode 10. The second layer 42 is provided between the light emitting portion 43 and the second electrode 20.

As the material of the light emitting portion 43, for example, Alq$_3$, F8BT, and PPV can be used. The light emitting portion 43 can be made of a mixed material including a host material and a dopant to be added to the host material. As the host material, for example, CBP, BCP, TPD, PKV, and PPT can be used. As the dopant material, for example, FIrpic, Ir(ppy)$_3$, and FIr6 can be used.

The first layer 41 functions as, for example, a hole injection layer. The first layer 41 functions as, for example, a hole transport layer. The first layer 41 may have, for example, a stacked structure including a layer which functions as the hole injection layer and a layer which functions as the hole transport layer. The first layer 41 may include other layers than the layer which functions as the hole injection layer and the layer which functions as the hole transport layer.

The second layer 42 can include a layer which functions as, for example, an electron injection layer. The second layer 42 can include, for example, a layer which functions as an electron transport layer. The second layer 42 may have, for example, a stacked structure including a layer which functions as the electron injection layer and a layer which functions as the electron transport layer. The second layer 42 may include other layers than the layer which functions as the electron injection layer and the layer which functions as the electron transport layer.

For example, the organic light emitting layer 40 emits light including visible light wavelength component. For example, the light emitted from the organic light emitting layer 40 is substantially white light. That is, the light emitted from the organic electroluminescent device 110 is white light. "White light" as referred to here is substantially white in color and includes, for example, red-based, yellow-based, green-based, blue-based, and purple-based white light.

The first electrode 10 includes an oxide containing at least one element selected from the group consisting of, for example, In, Sn, Zn, and Ti. The film of the first electrode 10 can be made of, for example, indium oxide, zinc oxide, indium tin oxide (ITO), fluorine-doped tin oxide (FTO), conductive glass containing indium zinc oxide (for example, NESA), gold, platinum, silver, and copper. The first electrode 10 functions as, for example, a positive electrode.

The second electrode 20 includes at least one of, for example, aluminum and silver. For example, the second electrode 20 is formed of an aluminum film. Further, the second electrode 20 may be made of an alloy of silver and magnesium. Calcium may be added to this alloy. The second electrode 20 functions as, for example, a negative electrode.

The interconnection layer 30 includes at least one of the group consisting of, for example, Mo, Ta, Nb, Al, Ni, and Ti. The interconnection layer 30 may be, for example, a mixed film including an element selected from this group. The interconnection layer 30 may be a stacked film including those elements. The interconnection layer 30 may include a stacked film of, for example, Nb/Mo/Al/Mo/Nb. The interconnection layer 30 functions as an auxiliary electrode that inhibits a potential drop at, for example, the first electrode 10. The interconnection layer 30 can function as a lead electrode configured to supply a current.

The first substrate 81 and the second substrate 82 may be made of, for example, a glass substrate or a resin substrate. The high-refractive index layer 84 may be made of, for example, polysiloxane in which titanium oxide is mixed. The refractive index of the high-refractive index layer 84 is adjusted by using, for example, the mixture ratio of titanium oxide.

FIG. 6A to FIG. 6D are schematic views illustrating the configuration of a portion of another organic electroluminescent device according to the first embodiment.

FIG. 6A to FIG. 6D show it by expanding a portion of the optical layer 50.

Figures 6A, 6B:
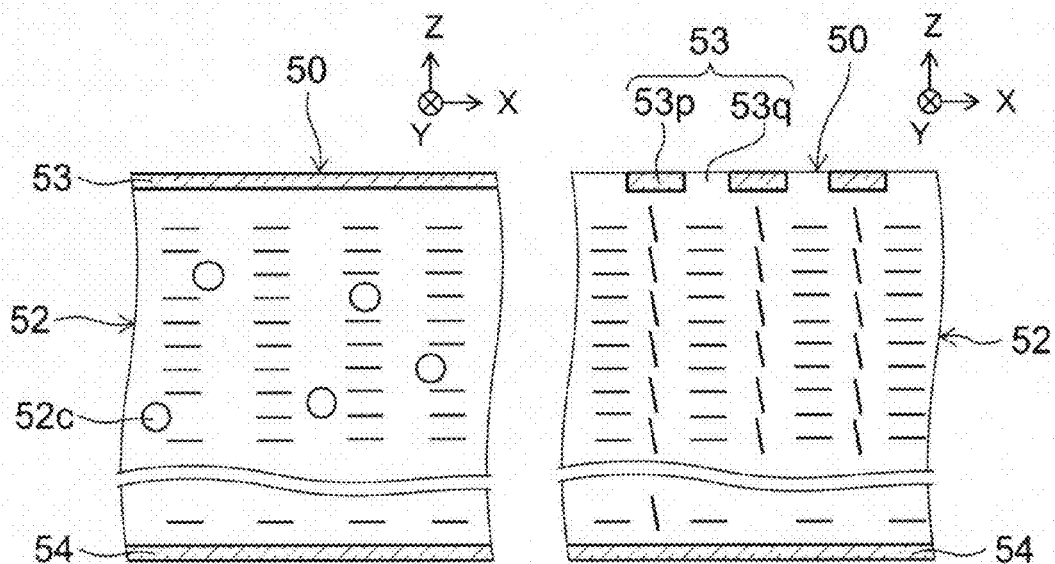
FIG. 6A to FIG. 6D are schematic views illustrating the configuration of a portion of another organic electroluminescent device according to the first embodiment.

As shown in FIG. 6A, as the optical layer 50, the liquid crystal layer 52 to which a conductive dopant 52c is added may be used. That is, the liquid crystal layer 52 may be of a liquid crystal type that utilizes the dynamic scattering effect (hereafter referred to as the DS effect). In the liquid crystal layer 52 that utilizes the DS effect, the dopant 52c (ion etc.) is added to set the specific resistance of the liquid crystal layer 52 not more than, for example, $5 \times 10^{10}$ Ωcm. As the liquid crystal, a material having, for example, negative dielectric anisotropy is used.

The optical layer 50 including this liquid crystal layer 52 becomes transparent if the voltage between the third electrode 53 and the fourth electrode 54 is at the first voltage. For example, if no voltage is supplied, the optical layer 50 enters the second state. In the optical layer 50, the dopant 52c moves if the absolute value (effective value) of the voltage between the third electrode 53 and the fourth electrode 54 is at the second voltage higher than the absolute value (effective value) of the first voltage. If the dopant 52c moves in condition where the voltage is applied, for example, scattering performance of light develops. That is, at the high second voltage, the optical layer 50 enters the first state.

As shown in FIG. 6B, the optical layer 50 may have a configuration including the third electrode 53 having a plurality of conductive portions 53p and a plurality of openings 53q. The openings 53q are formed in the shape of, for example, slits along the Y-axis direction. The openings 53q are arranged at, for example, constant spacing along the X-axis direction. The X-axis directional width of the opening 53q and the spacing between the neighboring two openings 53q are set corresponding to, for example, the wavelength of the emitted light 45. In the optical layer 50, if a voltage is applied between the third electrode 53 and the fourth electrode 54, incident light is scattered mainly by the diffraction effect owing to a difference in refractive index between the portion where the conductive portion 53p and the fourth electrode 54 face and the portion where the opening 53q and the fourth electrode 54 face. That is, if the applied voltage is high, the optical layer 50 enters the first state, and if the applied voltage is relatively low, it enters the second state.

Figures 6C, 6D:
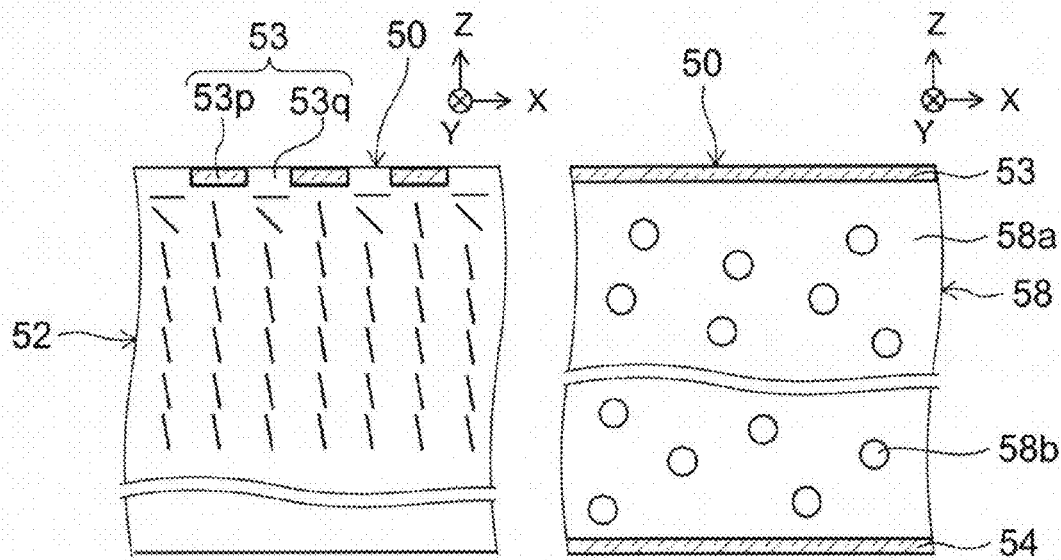

As shown in FIG. 6C, the optical layer 50 may have a configuration including the third electrode 53 having the plurality of conductive portions 53p and the plurality of openings 53q and the liquid crystal layer 52. In the optical layer 50, the neighboring two conductive portions 53p are set to different potentials. A lateral electric field is formed which goes from one of the neighboring two conductive portions 53p to the other. Thereby, for example, the direction of a liquid crystal molecule's director in the vicinity of the opening 53q is changed. In such a manner, the incident light is scattered due to a difference in refractive index between the portion where the conductive portion 53p and the liquid crystal layer 52 face and the portion where the opening 53q and the liquid crystal layer 52 face. If the applied voltage is high, the optical layer 50 enters the first state, and if the applied voltage is relatively low, it enters the second state.

As shown in FIG. 6D, the optical layer 50 may have a configuration including the third electrode 53, the fourth electrode 54, and an electrophoretic layer 58 placed between the third electrode 53 and the fourth electrode 54. The electrophoretic layer 58 has, for example, an electrophoretic dispersion liquid 58a and a charged microparticle 58b added to the electrophoretic dispersion liquid 58a. A porous structure may be provided so that a gap between the porous structures may be filled with the electrophoretic dispersion liquid 58a. In the optical layer 50, if a voltage is applied between the third electrode 53 and the fourth electrode 54, the charged microparticles 58b gather near the third electrode 53 or the fourth electrode 54 so that the electrophoretic dispersion liquid 58a may become clouded, thereby scattering the incident light. That is, if the applied voltage is high, the optical layer 50 enters the first state, and if the applied voltage is relatively low, it enters the second state. Thus, the optical layer 50 may be made of any material other than liquid crystal.

Figure 7A:
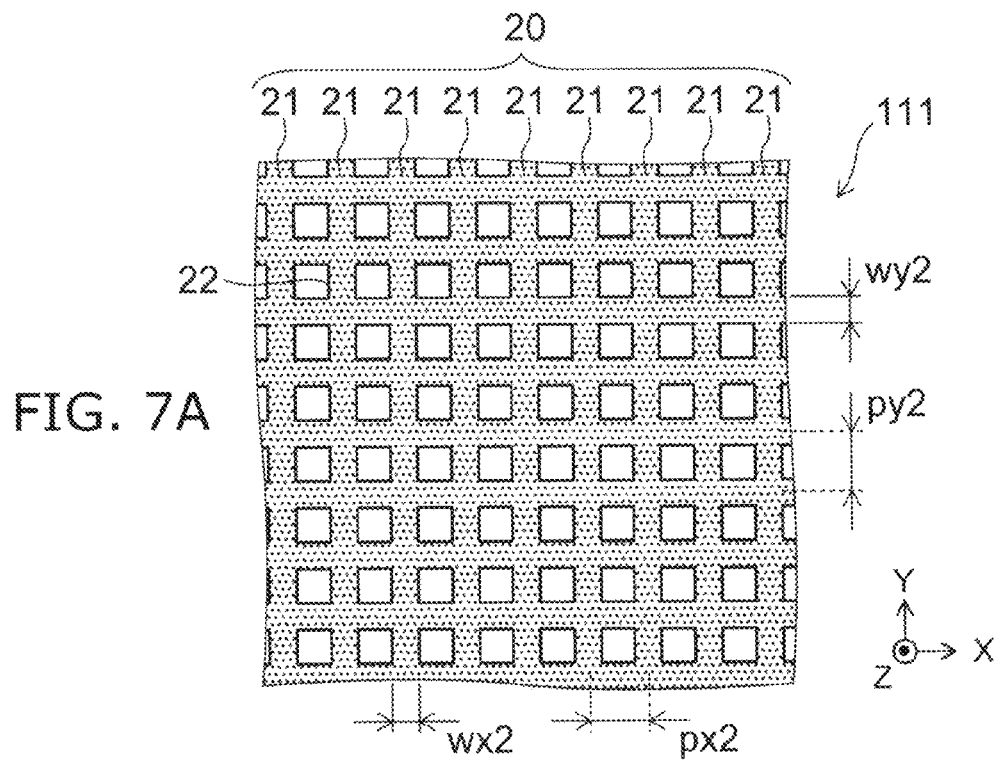
FIG. 7A and FIG. 7B are schematic plan views illustrating the configuration of another organic electroluminescent device according to the first embodiment.
Figure 7B:
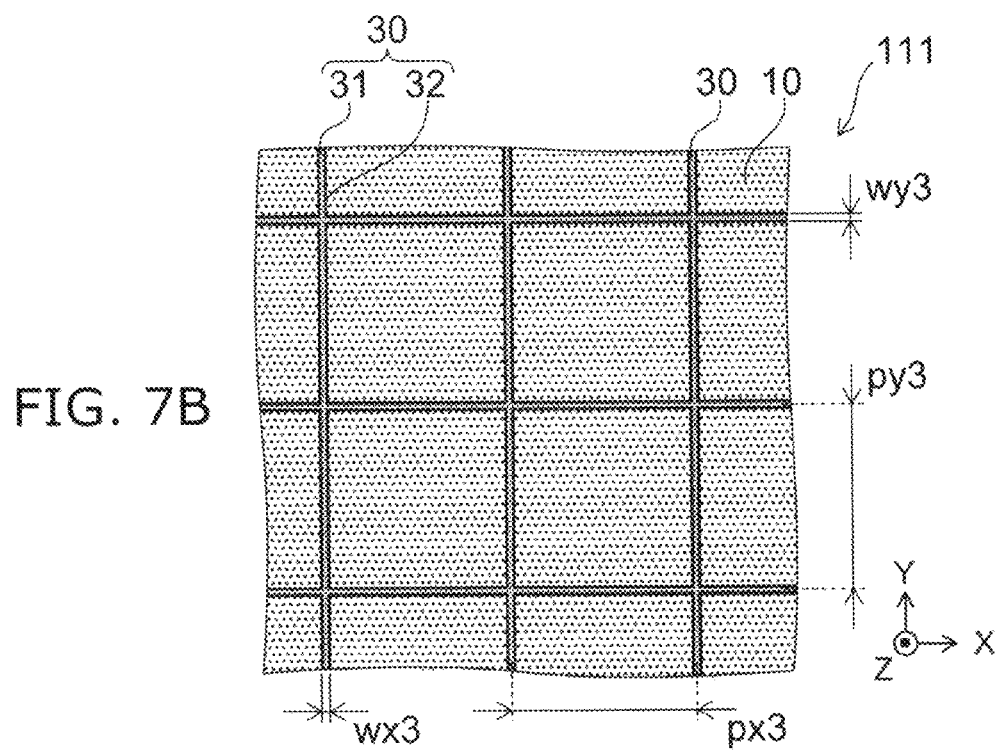

FIG. 7A and FIG. 7B are schematic plan views illustrating the configuration of another organic electroluminescent device according to the first embodiment.

FIG. 7A shows an example of a pattern shape of the second electrode 20 of an organic electroluminescent device 111 according to the embodiment. FIG. 7B shows an example of the pattern shape of the interconnection layer 30 of the organic electroluminescent device 111.

As shown in FIG. 7A, in the organic electroluminescent device 111, the second electrode 20 (conductive portion 21) has a lattice configuration. In this example, the shape of the opening 22 provided on the second electrode 20 is square (rectangular). The shape of the opening 22 is not limited to square but arbitrary. For example, the lattice pattern of the second electrode 20 may be shaped like a honeycomb.

Further, as shown in FIG. 7B, the interconnection layer 30 (interconnection portion 31) has a lattice configuration. In this example, the shape of the opening 32 provided on the interconnection layer 30 is square (rectangular). The shape of the opening 32 is not limited to square but arbitrary. The shape of the opening 32 may be formed to match the shape of the opening 22, for example.

To make the pattern of the second electrode 20 lattice-shaped, the pattern of the facing portion 55 of the third electrode 53 of the optical layer 50 is also made lattice-shaped. The pattern shape of the facing portion 55 is made substantially the same as that of the second electrode 20. The shape of the non-facing portion 56 is made substantially the same as that of the opening 22. Thereby, the organic electroluminescent device 111 can also provide a light transmissive organic electroluminescent device. The organic electroluminescent device 111 can also obtain a high luminous efficiency and high transparency.

An X-axis directional length of the second electrode 20 is taken to be a width wx2. An X-axis directional center-to-center distance of the two neighboring second electrodes 20 (conductive portions 21) among the plurality of second electrodes 20 (conductive portions 21) is taken to be a pitch px2.

The Y-axis directional length of the portion of the second electrode 20 that extends along the X-axis direction is taken to be a width wy2. A Y-axis directional center-to-center distance of two of the plurality of second electrodes 20 (conductive portions 21) that neighbor each other in the Y-axis direction is taken to be a pitch py2.

For example, at least either one of the width wx2 and the width wy2 is not less than 1 µm and not more than 2000 µm. Specifically, at least one of the width wx2 and the width wy2 is not less than 10 µm. By setting the widths wx2 and wx2 not less than 10 µm, workability becomes better. The widths wx2 and wy2 are not more than 500 µm. By setting the widths wx2 and wy2 not more than 500 µm, the second electrode 20 becomes less conspicuous. At least either one of the widths wx2 and wy2 is, for example, not less than 30 µm and not more than 200 µm.

At least one of the pitches px2 and py2 is not less than 50 µm and not more than 5000 µm. For example, the pitches px2 and py2 are each set to not less than 400 µm and not more than 500 µm and the widths wx2 and wy2 are each set not less than 40 µm and not more than 60 µm. In this case, the second electrode 20 can be formed by photolithography and etching.

For example, the pitches px2 and py2 are each set to not less than 800 µm and not more than 1000 µm and the widths wx2 and wy2 are each set not less than 80 µm and not more than 120 µm. In this case, the second electrode 20 can be formed by, for example, film formation (for example, evaporation) by use of a metal mask.

The X-axis directional length of the interconnection layer 30 is taken to be a width wx3. An X-axis directional center-to-center distance of the two neighboring interconnection layers 30 (interconnection portions 31) among the plurality of interconnection layers 30 (interconnection portions 31) is taken to be a pitch px3.

A Y-axis directional length of the portion of the interconnection layer 30 that extends along the X-axis direction is taken to be a width wy3. A Y-axis directional center-to-center distance of the two interconnection layers 30 (interconnection portions 31) that neighbor in the Y-axis direction among the above portions of the plurality of interconnection layers 30 (interconnection portions 31) is taken to be a pitch py3.

For example, at least one of the width wx3 and the width wy3 is not less than 1 µm and not more than 2000 µm. Specifically, at least one of the widths wx3 and wy3 is not less than 10 µm. By setting the widths wx3 and wy3 not less than 10 µm, workability becomes better. The resistance decreases to enhance in-plane uniformity of the emission intensity. The widths wx3 and wy3 are each not more than 500 µm. By setting the widths wx2 and wy2 not more than 500 µm, the interconnection layer 30 becomes less conspicuous. At least one of the widths wx3 and wy3 is, for example, not less than 10 µm and not more than 200 µm.

At least one of the pitches px3 and py3 is, for example, not less than 50 µm and not more than 5000 µm.

For example, the pitches px3 and py3 are each set not less than 400 µm and not more than 500 µm and the widths wx3 and wy3 are each set not less than 40 µm and not more than 60 µm. In this case, the interconnection layer 30 can be formed by, for example, photolithography and etching.

For example, the pitches px3 and py3 are each set not less than 800 µm and not more than 1000 µm and the widths wx3 and wy3 are each set not less than 80 µm and not more than 120 µm. In this case, the interconnection layer 30 can be formed by, for example, film formation (for example, evaporation) by use of a metal mask.

In the embodiment, if the pattern line widths of the second electrode 20 and the interconnection layer 30 are large (width of the conductive portion 21 and width of the interconnection portion 31 are large), the second electrode 20 and the interconnection layer 30 can be observed easily and is conspicuous. If the second electrode 20 and the interconnection layer 30 are conspicuous, it is difficult to recognize a background image.

The inventors of the application have discussed conditions for making the second electrode 20 and the interconnection layer 30 less conspicuous. In a specimen used in the discussion, a plurality of belt-shaped Ag films are provided on a glass substrate. The Ag films correspond to the second electrode 20 and the interconnection layer 30. The Ag film has a belt-shaped pattern pitch (which corresponds to the pitches py2 and py3) set to a constant value of 200 µm. The specimen used has an Ag-film belt-shaped pattern (which corresponds to the widths wy2 and wy3) set to a variable value between 20 µm and 100 µm. If the Ag film has a belt-shaped pattern width of 100 µm, the aperture ratio is 50%. By disposing white paper behind the specimen and setting a distance D between the specimen and an observer to 0.3 m, a minimum width with which the Ag-film belt-shaped pattern could be observed was obtained. The observer had an eyesight of 1.2 and was inside the room under fluorescent light as an evaluation environment.

As a result, if the plurality of Ag-film belt-shaped patterns are not less than 50 µm, they could be observed to be separate from each other, whereas if they are not more than 40 µm, they could not be observed. That is, if they are not more than 40 µm, the entirety of the specimen was observed as a gray region with a decreased transmittance. If the belt-shaped pattern is 40 µm, the aperture ratio is, for example, 71%. Further, if the width was 20 µm (aperture ratio: 83%), a difference decreased between brightness of the region where the belt-shaped patterns were provided and that of the other region, resulting in smaller sense of discomfort.

In such a manner, in the embodiment, the aperture ratio of the second electrode 20 (for example, ratio of a total of areas of the X-Y plane to which the plurality of openings 22 are projected with respect to the area of the X-Y plane to which the conductive portion 21 is projected) is, for example, not less than 71%. Further, the aperture ratio of the second electrode 20 is, for example, not less than 83%. By enhancing the aperture ratio of the second electrode 20, the transmittance of the organic electroluminescent device improves. However, if the aperture ratio increases, the area of the light emitting region 44 decreases.

Similarly, in the embodiment, the aperture ratio of the interconnection layer 30 is, for example, not less than 71%. The aperture ratio of the interconnection layer 30 is, for example, not less than 83%.

In a display device, it is said that if the angle of sight of the width of one picture element as viewed from the observer is about not more than 0.028 degree, the picture element becomes invisible (indistinguishable). This substantially agrees with the above results that if the width is not more than 40 µm when a distance D between the specimen and the observer is 30 cm, the belt-shaped patterns cannot be seen.

It is assumed that a distance between the organic electroluminescent device and the observer is a distance D and a width that the pattern cannot be observed is a pattern width wa. The pattern width wa corresponds to the maximum widths wx2, wy2, wx3, and wxy3.

The pattern width wa at which the patterns cannot be observed is proportional to the distance D. When the distance D is 0.3 m, the pattern width wa is 40 µm. When the distance D is 6 m, the pattern width wa is 600 µm. In a case where the organic electroluminescent device according to the embodiment is used in lighting, the distance D between the relevant lighting apparatus and the user (observer) can be changed variously. In the embodiment, based on the distance D in accordance with usage, the widths wx2, wy2, wx3, and wy3 are determined.

Figure 8:
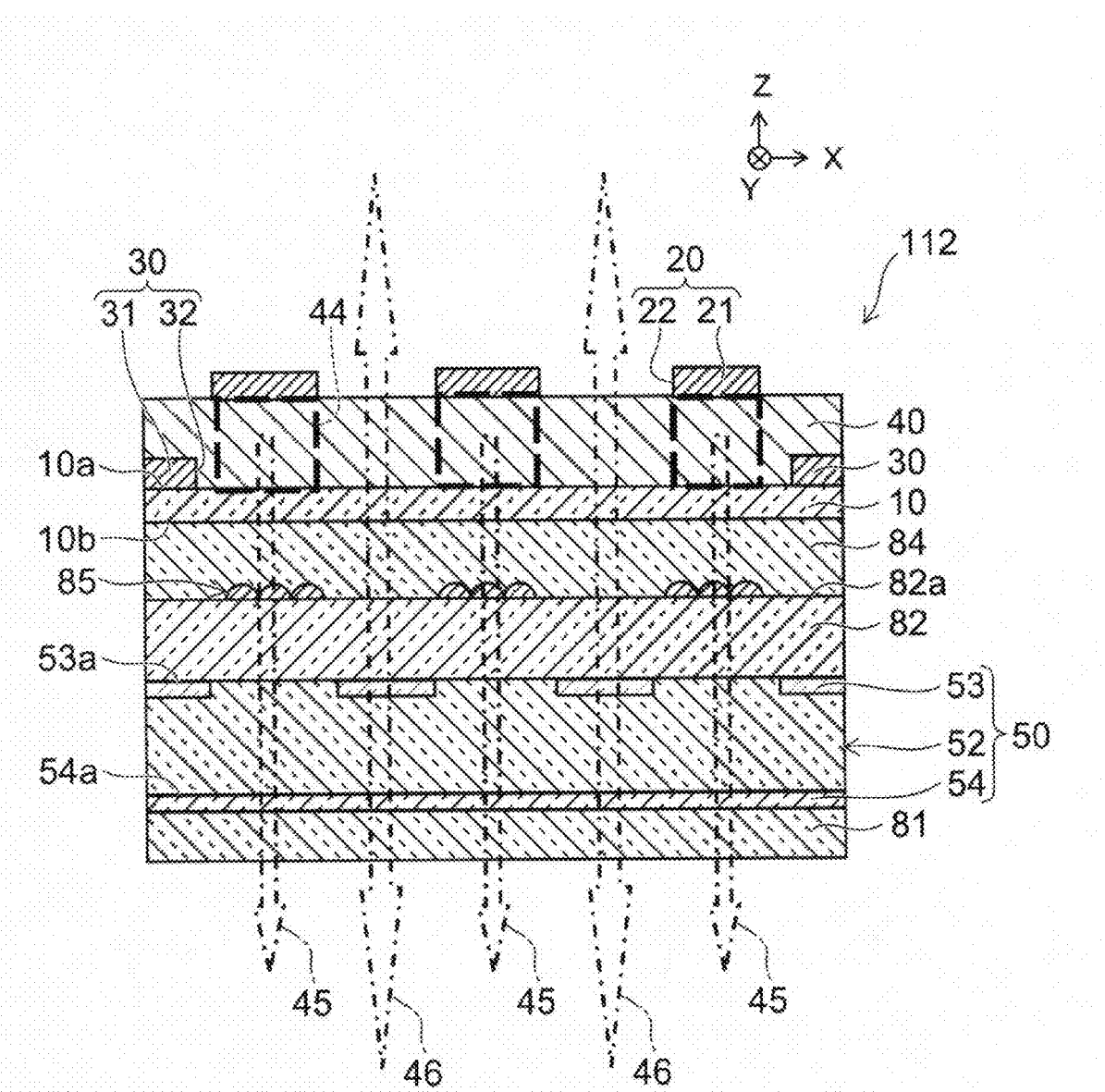
FIG. 8 is a schematic cross-sectional view illustrating the configuration of another organic electroluminescent device according to the first embodiment.

FIG. 8 is a schematic cross-sectional view illustrating the configuration of another organic electroluminescent device according to the first embodiment.

FIG. 8 is a cross-sectional view corresponding to the cross section taken along line A1-A2 of FIG. 2.

As shown in FIG. 8, in the still further organic electroluminescent device 112 according to the embodiment, the third electrode 53 is provided to a portion that does not overlap with the second electrode 20 when projected to the X-Y plane. That is, the third electrode 53 of the organic electroluminescent device 112 is provided only with the non-facing portion 56 of the second electrode 53 of the organic electroluminescent device 110.

In the organic electroluminescent device 112, the optical characteristics of a portion of the liquid crystal layer 52 that does not overlap with the second electrode 20 when projected to the X-Y plane are changed between the first state and the second state. The optical layer 50 of the organic electroluminescent device 112 may have the configuration of any one of FIG. 3A to FIG. 3C and FIG. 6A to FIG. 6D. The organic electroluminescent device 112 should well suitably use the optical layer 50 that enters, like the liquid crystal layer 52 using polymer dispersion type liquid crystal, the first state when supplied with no voltage and enters the second state when supplied with a voltage. Thereby, in the organic electroluminescent device 112, the optical characteristics of the liquid crystal layer 52 change between the first state and third state.

The organic electroluminescent device 112 can also provide a light transmissive organic electroluminescent device.

The organic electroluminescent device 112 can also obtain a high luminous efficiency and high transparency. In such a manner, the third electrode 53 needs not to be provided all over the liquid crystal layer 52 but only needs to be provided at least to the portion that needs to be switched between the first and second states.

Figure 9:
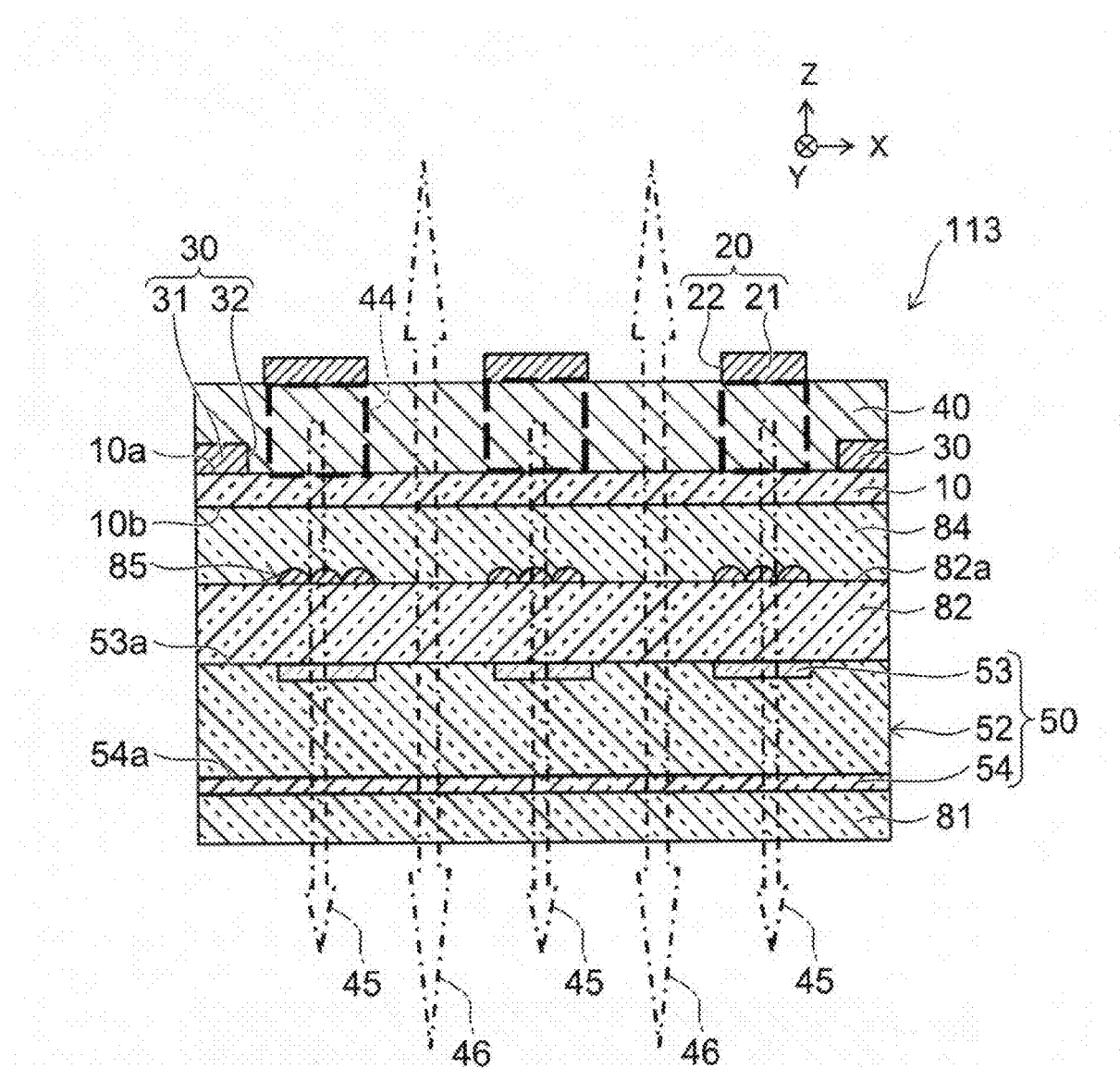
FIG. 9 is a schematic cross-sectional view illustrating the configuration of an additional organic electroluminescent device according to the first embodiment.

FIG. 9 is a schematic cross-sectional view illustrating the configuration of another organic electroluminescent device according to the first embodiment.

FIG. 9 is a cross-sectional view corresponding to the cross section taken along line A1-A2 of FIG. 2, for example.

As shown in FIG. 9, in the additional organic electroluminescent device 113 according to the embodiment, the third electrode 53 is provided to a portion that overlaps with the second electrode 20 when projected to the X-Y plane. That is, the third electrode 53 of the organic electroluminescent device 113 is provided only with the facing portion 55 of the second electrode 53 of the organic electroluminescent device 110.

In the organic electroluminescent device 113, the optical characteristics of a portion of the liquid crystal layer 52 that overlaps with the second electrode 20 when projected to the X-Y plane are changed between the first state and the second state. The optical layer 50 of the organic electroluminescent device 113 may have the configuration of any one of FIG. 3A to FIG. 3C and FIG. 6A to FIG. 6D. The organic electroluminescent device 113 should well suitably use the optical layer 50 that enters, like the liquid crystal layer 52 using the DS effect, the first state when supplied with a voltage and enters the second state when supplied with no voltage. Accordingly, in the organic electroluminescent device 113, the optical characteristics of the liquid crystal layer 52 change between the second state and third state.

In this way, the organic electroluminescent device 113 can also provide a light transmissive organic electroluminescent device. The organic electroluminescent device 113 can also obtain a high luminous efficiency and high transparency.

Figure 10:
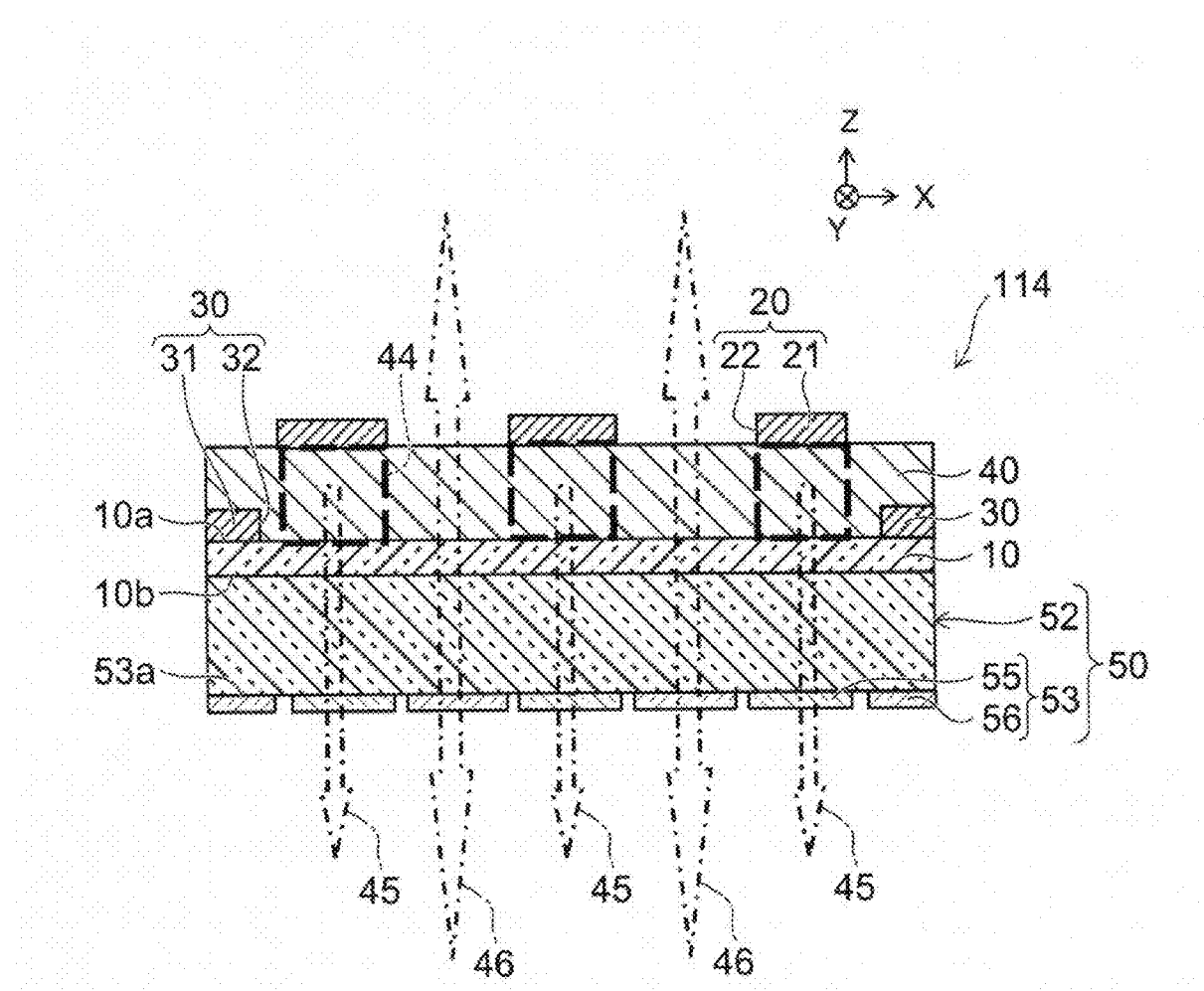
FIG. 10 is a schematic cross-sectional view illustrating the configuration of another organic electroluminescent device according to the first embodiment.

FIG. 10 is a schematic cross-sectional view illustrating the configuration of another organic electroluminescent device according to the first embodiment.

FIG. 10 is a cross-sectional view corresponding to the cross section taken along line A1-A2 of FIG. 2, for example.

As shown in FIG. 10, the optical layer 50 of the additional organic electroluminescent device 114 according to the embodiment includes the third electrode 53 having the third major surface 53a parallel to the second major surface 10b and the liquid crystal layer 52 provided between the first electrode 10 and the third electrode 53. That is, in the organic electroluminescent device 114, the first electrode 10 is used both in light emission from the organic light emitting layer 40 and in switchover of the optical characteristics of the liquid crystal layer 52. The optical layer 50 of the organic electroluminescent device 114 may have the configuration of any one of FIG. 3A to FIG. 3C and FIG. 6A to FIG. 6D.

The organic electroluminescent device 114 can also provide a light transmissive organic electroluminescent device. The organic electroluminescent device 114 can also obtain a high luminous efficiency and high transparency. Further, the organic electroluminescent device 114 can reduce the number of the components as compared to the organic electroluminescent device 110. Thereby, the organic electroluminescent device 114 can, for example, be manufactured easily.

Figure 11:
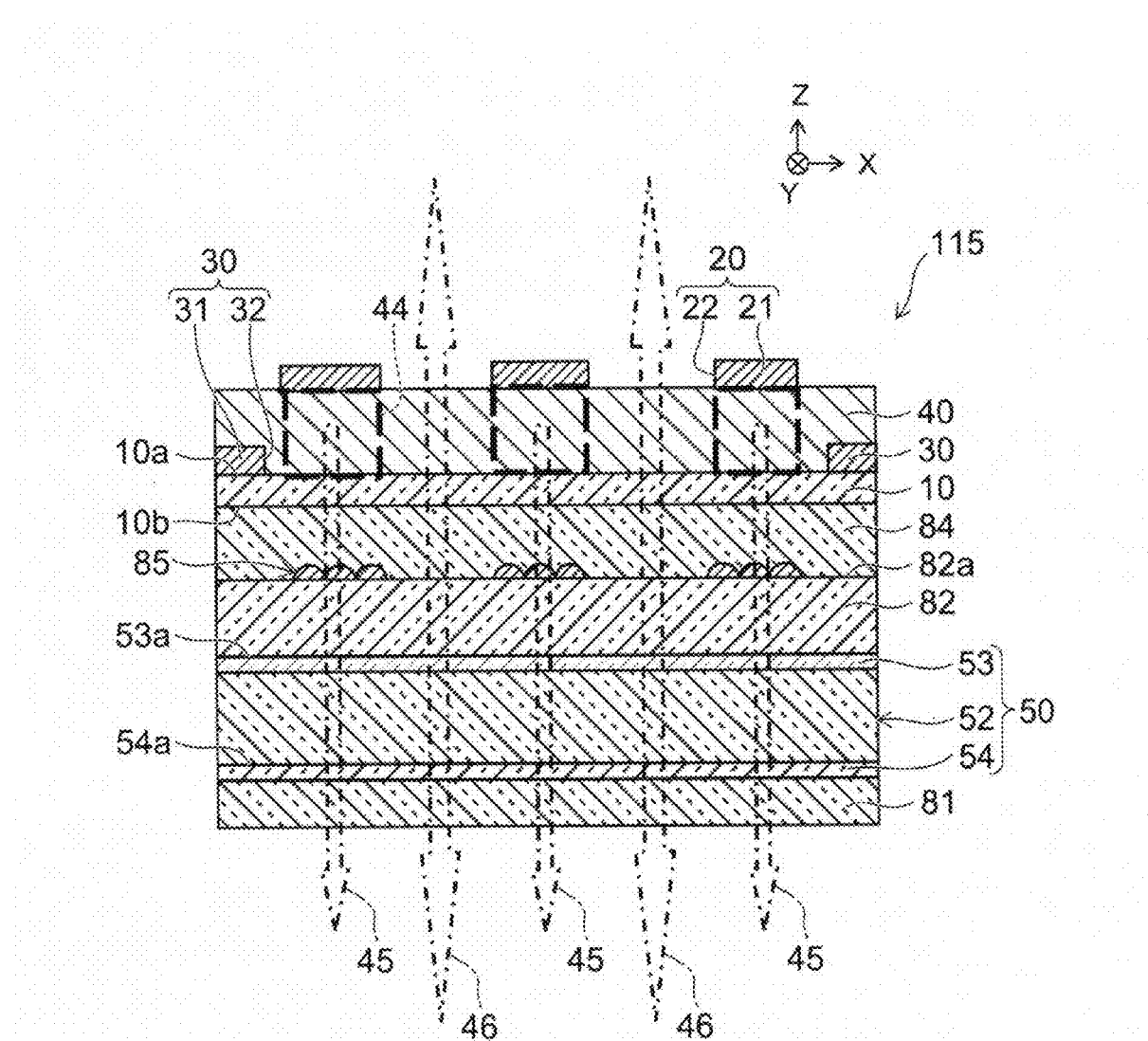
FIG. 11 is a schematic cross-sectional view illustrating the configuration of another organic electroluminescent device according to the first embodiment.

FIG. 11 is a schematic cross-sectional view illustrating the configuration of another organic electroluminescent device according to the first embodiment.

FIG. 11 is a cross-sectional view corresponding to the cross section taken along line A1-A2 of FIG. 2, for example.

As shown in FIG. 11, the optical layer 50 of the additional organic electroluminescent device 115 according to the embodiment includes one third electrode 53. The third major surface 53a of the third electrode 53 faces the whole surface of the second major surface 10b of the first electrode 10. The third electrode 53 is provided to each of a portion that overlaps with the second electrode 20 and a portion that does not overlap with it when projected to the X-Y plane. That is, the shape of the third major surface 53a of the third electrode 53 is substantially the same as that of the second major surface 10b of the first electrode 10.

In the optical layer 50, the entirety of the liquid crystal layer 52 is switched between the first state and the second state. In such a manner, the third electrode 53 may be one electrode that faces the whole surface of the second major surface 10b. The optical layer 50 of the organic electroluminescent device 115 may have the configuration of any one of FIG. 3A to FIG. 3C and FIG. 6A to FIG. 6D. The organic electroluminescent device 115 can also provide a light transmissive organic electroluminescent device. The organic electroluminescent device 115 can also obtain a high luminous efficiency and high transparency.

(Second Embodiment)

Figure 12:
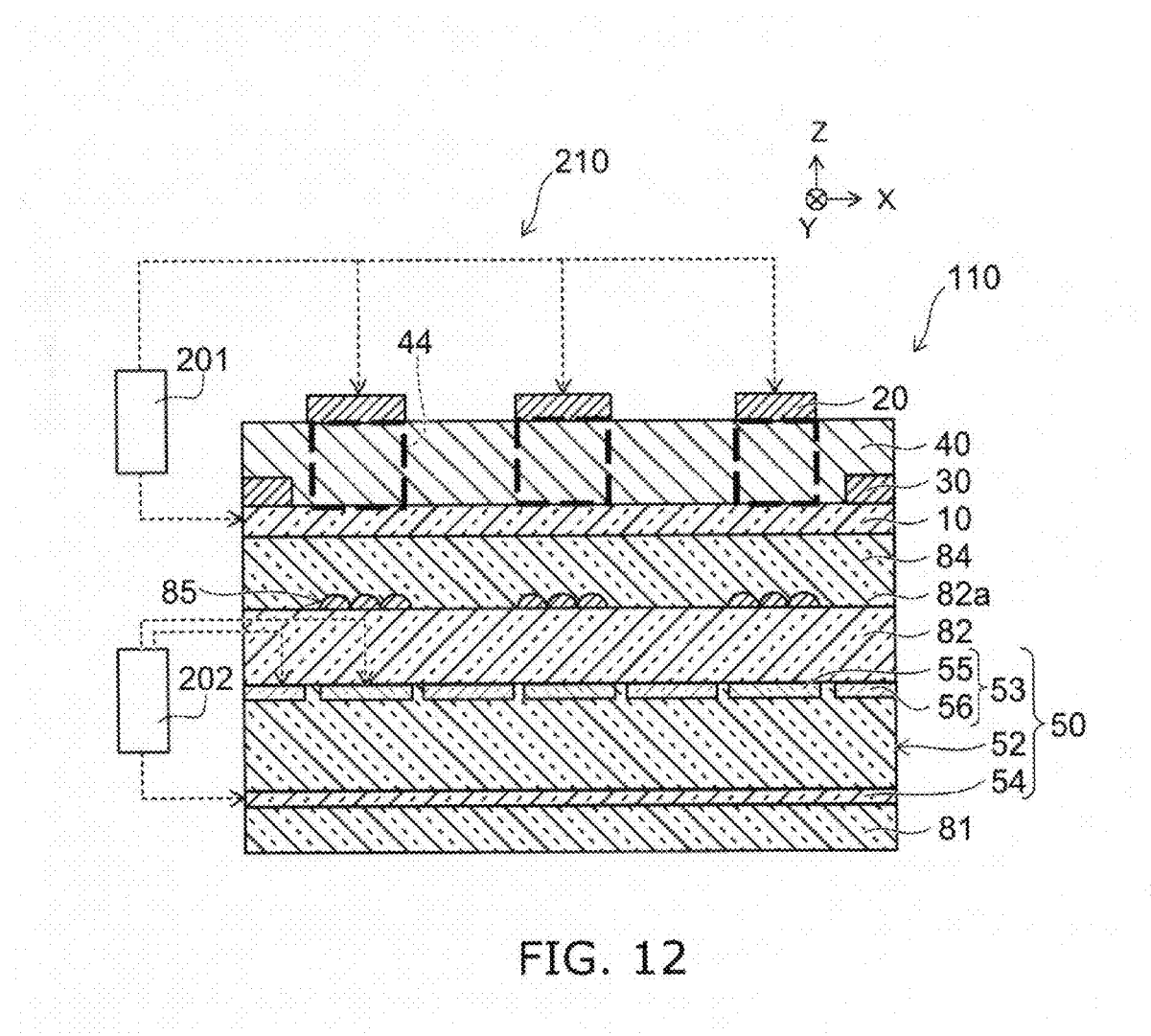
FIG. 12 is a schematic view illustrating the configuration of a lighting apparatus according to a second embodiment.

FIG. 12 is a schematic view illustrating the configuration of a lighting apparatus according to a second embodiment.

As shown in FIG. 12, a lighting apparatus 210 according to the embodiment includes an organic electroluminescent device (for example, the organic electroluminescent device 110) according to the first embodiment, a power supply unit 201, and a control unit 202.

The power supply unit 201 is electrically connected to a first electrode 10 and a second electrode 20. The power supply unit 201 supplies a current to an organic light emitting layer 40 via the first electrode 10 and the second electrode 20.

The control unit 202 is electrically connected to, for example, a third electrode 53 and a fourth electrode 54. The control unit 202 is electrically connected individually to, for example, a facing portion 55 and a non-facing portion 56 of the third electrode 53. The control unit 202 gives rise to an electric field between the facing portion 55 and the fourth electrode 54 by applying a voltage between the facing portion 55 and the fourth electrode 54, for example. The control unit 202 gives rise to an electric field between the non-facing portion 56 and the fourth electrode 54 by applying a voltage between the non-facing portion 56 and the fourth electrode 54, for example. Thus, the control unit 202 controls switchover of the optical layer 50 among the first state, the second state, and the third state.

The lighting apparatus 210 according to the embodiment can provide a lighting apparatus having a high luminous efficiency and high transparency. The configuration of the control unit 202 may be changed appropriately in accordance with the configuration of the third electrode 53. The control unit 202 only needs to be electrically connected to at least the third electrode 53 and the fourth electrode 54 so that the liquid crystal layer 52 at a portion where the third electrode 53 and the fourth electrode 54 face can be switched between the first state and the second state.

(Third Embodiment)

The embodiment relates to a method for manufacturing an organic electroluminescent device. The embodiment corresponds to a portion of a method for manufacturing the lighting apparatus.

Figure 13A:
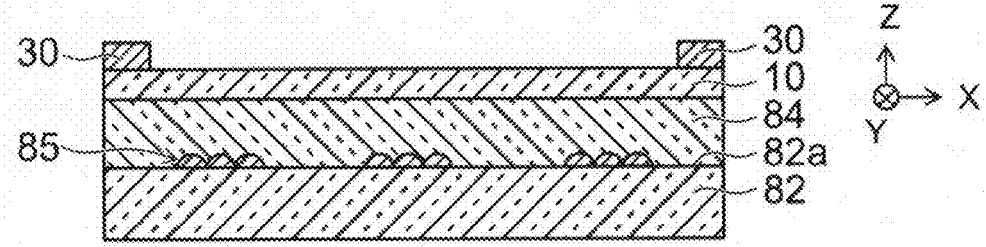
FIG. 13A to FIG. 13C are schematic cross-sectional views illustrating a method for manufacturing an organic electroluminescent device according to a third embodiment in order of processes.
Figure 13B:
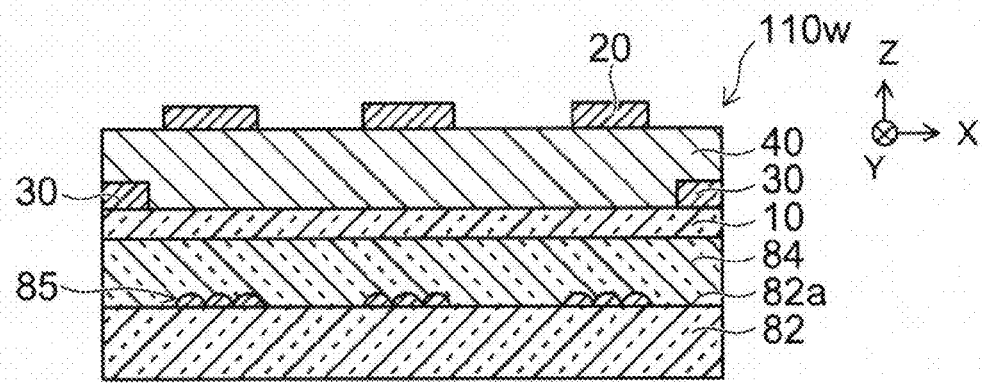
Figure 13C:
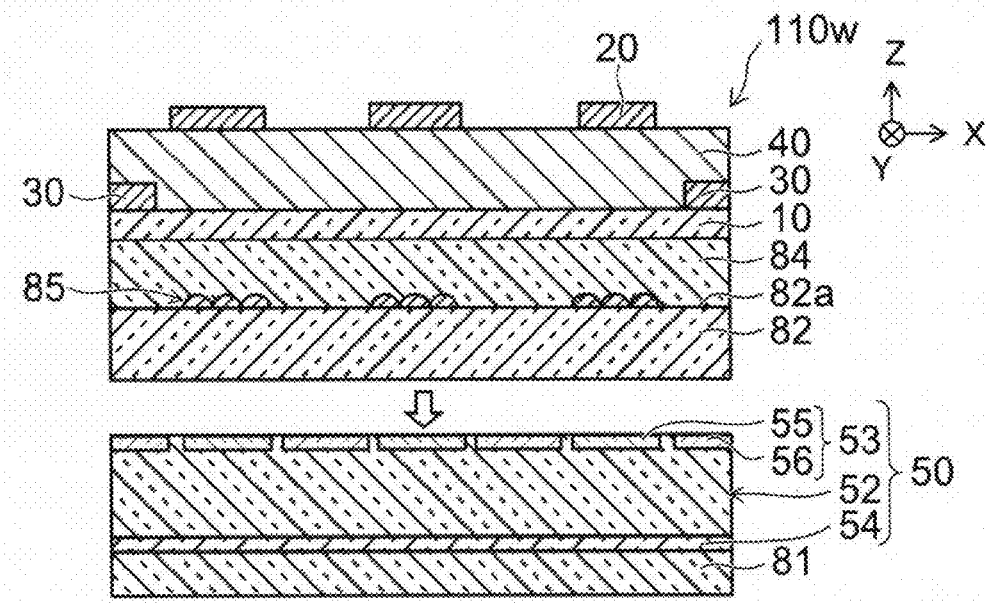

FIG. 13A to FIG. 13C are schematic cross-sectional views illustrating a method for manufacturing an organic electroluminescent device according to a third embodiment in order of processes.

As shown in FIG. 13A, for example, an irregular portion 85 is formed on a second substrate 82. The irregular portion 85 is formed by, for example, applying a microlens sheet on a major surface 82a of the second substrate 82. A high-refractive index layer 84 is formed on the major surface 82a of the second substrate 82 and the irregular portion 85. The high-refractive index layer 84 can be formed by, for example, application or printing. A first electrode 10 is formed on the high-refractive index layer 84. An interconnection layer 30 is formed on the first electrode 10. The interconnection layer 30 is formed by, for example, photolithography and etching. Film formation (evaporation etc.) by use of masks may be used.

As shown in FIG. 13B, an organic light emitting layer 40 is formed on the first electrode 10 and the interconnection layer 30. A second electrode 20 is formed on the organic light emitting layer 40. The second electrode 20 pattern is formed using, for example, photolithography and etching. Film formation (evaporation etc.) by use of masks may be used. Thereby, a workpiece 110w is formed.

As shown in FIG. 13C, an optical layer 50 including a third electrode 53, a fourth electrode 54, and a liquid crystal layer 52 is formed on the first substrate 81. The workpiece 110w is placed on the optical layer 50 for alignment and then the optical layer 50 and the second substrate 82 are adhered to each other. With this, the organic electroluminescent device 110 is finished.

Figure 14:
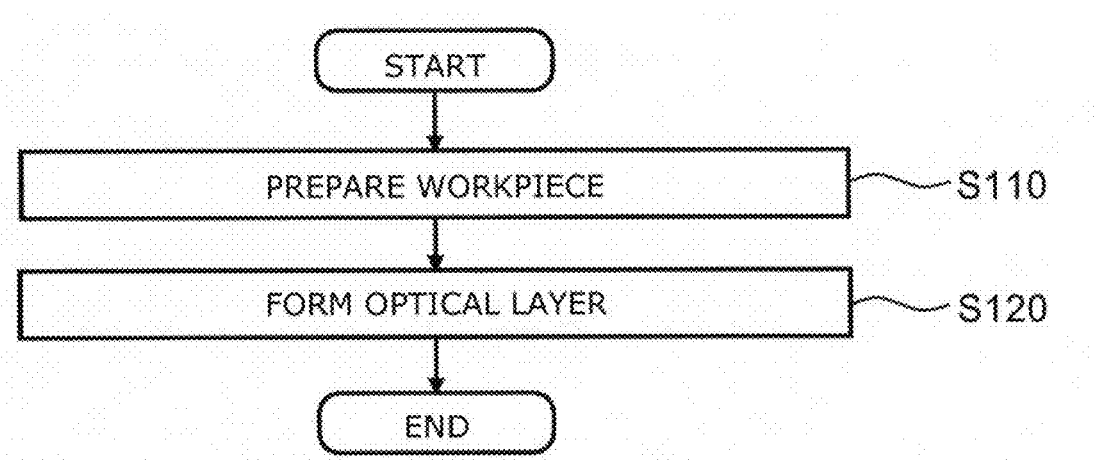
FIG. 14 is a flowchart illustrating the method for manufacturing the organic electroluminescent device according to the third embodiment.

FIG. 14 is a flowchart illustrating the method for manufacturing the organic electroluminescent device according to the third embodiment.

As shown in FIG. 14, the method for manufacturing the organic electroluminescent device 110 according to the embodiment includes step S110 of preparing the workpiece 110w and step S120 of forming the optical layer 50.

In step S110, the processing described with reference to, for example, FIG. 13A and FIG. 13B is performed. In step S120, the processing described with reference to, for example, FIG. 13C is performed.

Thereby, the light transmissive organic electroluminescent device 110 is manufactured. The organic electroluminescent device 110 has a high luminous efficiency and high transparency.

The embodiment provides a light transmissive organic electroluminescent device, a lighting apparatus, and a method for manufacturing the organic electroluminescent device.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, the embodiments of the invention have been described with reference to the specific examples. However, the embodiments of the invention are not limited to those specific examples. For example, the specific configurations of the first electrode, the second electrode, the organic light emitting layer, the optical layer, the third electrode, the fourth electrode, the liquid crystal layer, the facing and non-facing portions included in the organic electroluminescent device, and the components such as the power supply portion included in the lighting apparatus are covered by the invention as long as those skilled in the art can obtain the same effects by similarly carrying out the invention by appropriately selecting them from the publicly known scope.

Further, any two or more components of the specific examples may be combined within the extent of technical feasibility and are included in the scope of the invention to the extent that the purport of the invention is included.

Moreover, all organic electroluminescent devices, lighting apparatuses and methods for manufacturing the organic electroluminescent device practicable by an appropriate design modification by one skilled in the art based on the organic electroluminescent devices, the lighting apparatuses and the methods for manufacturing the organic electroluminescent devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent device comprising:
a first electrode having a first major surface and a second major surface opposite to the first major surface and being light transmissive;
a second electrode facing a portion of the first major surface;
an organic light emitting layer provided between the first electrode and the second electrode; and
an optical layer, the organic light emitting layer and the first electrode being disposed between the optical layer and the second electrode, the optical layer being able to transit between a first state where a traveling direction of light emitted from the organic light emitting layer is changed and a second state having a smaller degree of the change in the traveling direction of the light than the first state.

2. The device according to claim 1, wherein
the optical layer includes
a third electrode having a third major surface parallel to the second major surface, the third electrode being light transmissive,
a fourth electrode having a fourth major surface parallel to the third major surface, the fourth electrode being light transmissive, and
a liquid crystal layer provided between the third electrode and the fourth electrode.

3. The device according to claim 2, wherein
the third electrode includes
a facing portion provided to a portion overlapping with the second electrode when projected to a plane parallel to the first major surface, and
a non-facing portion provided, separately from the facing portion, to a portion not overlapping with the second electrode when projected to the plane.

4. The device according to claim 2, wherein the third electrode is provided only to a portion not overlapping with the second electrode when projected to a plane parallel to the first major surface.

5. The device according to claim 4, wherein the liquid crystal layer enters the first state when a voltage between the third electrode and the fourth electrode is a first voltage and enters the second state when an absolute value of the voltage between the third electrode and the fourth electrode is a second voltage higher than an absolute value of the first voltage.

6. The device according to claim 5, wherein the liquid crystal layer is a polymer dispersion-type liquid crystal.

7. The device according to claim 2, wherein the third electrode is provided only to a portion overlapping with the second electrode when projected to a plane parallel to the first major surface.

8. The device according to claim 7, wherein the liquid crystal layer enters the second state when a voltage between the third electrode and the fourth electrode is a first voltage and enters the first state when an absolute value of the voltage between the third electrode and the fourth electrode is a second voltage higher than an absolute value of the first voltage.

9. The device according to claim 8, wherein the liquid crystal layer includes a conductive dopant and is of a liquid crystal type utilizing dynamic scattering effects.

10. The device according to claim 2, wherein the third electrode is provided to each of a portion overlapping with the second electrode and a portion not overlapping with the second electrode when projected to a plane parallel to the first major surface.

11. The device according to claim 1, wherein
the optical layer includes
a third electrode having a third major surface parallel to the second major surface, and
a liquid crystal layer provided between the first electrode and the third electrode.

12. The device according to claim 1, further comprising:
a high-refractive index layer provided between the first electrode and the optical layer,
each of refractive indexes of the first electrode, the organic light emitting layer, and the high-refractive index layer is not less than 1.6 and not more than 2.0.

13. The device according to claim 12, further comprising an irregular portion provided between the optical layer and the high-refractive index layer and disposed at a position overlapping with the second electrode when projected to a plane parallel to the first major surface.

14. The device according to claim 1, further comprising an interconnection layer provided between the first electrode and the organic light emitting layer and disposed at a portion of the portion not overlapping with the second electrode when projected to a plane parallel to the first major surface.

15. The device according to claim 1, wherein the first electrode includes an oxide including at least one element selected from the group consisting of In, Sn, Zn, and Ti.

16. The device according to claim 1, wherein the second electrode includes at least one of aluminum and silver.

17. A lighting apparatus comprising:
an organic electroluminescent device including:
   a first electrode having a first major surface and a second major surface opposite to the first major surface and being light transmissive;
   a second electrode facing a portion of the first major surface;
   an organic light emitting layer provided between the first electrode and the second electrode; and
   an optical layer facing the second major surface and being able to transit between a first state where a traveling direction of light emitted from the organic light emitting layer is changed and a second state having a smaller degree of the change in the traveling direction of the light than the first state; and
a power supply unit electrically connected to the first electrode and the second electrode to supply a current to the organic light emitting layer via the first electrode and the second electrode.

18. The apparatus according to claim 17, wherein the optical layer includes
   a third electrode having a third major surface parallel to the second major surface,
   a fourth electrode having a fourth major surface parallel to the third major surface, and
   a liquid crystal layer provided between the third electrode and the fourth electrode,
the apparatus further includes a control unit electrically connected to the third electrode and the fourth electrode and configured to control switchover of the optical layer between the first state and the second state by applying a voltage between the third electrode and the fourth electrode.

19. The apparatus according to claim 18, wherein
the third electrode includes
   a facing portion provided to a portion overlapping with the second electrode when projected to a plane parallel to the first major surface, and
   a non-facing portion provided, separately from the facing portion, to a portion not overlapping with the second electrode when projected to the plane,
the control unit applies a voltage between the facing portion and the fourth electrode and applies a voltage between the non-facing portion and the fourth electrode to further make switchover of the optical layer to a third state, the third state where a portion of the liquid crystal layer not overlapping with the second electrode when projected to the plane is in the second state and a portion of the liquid crystal layer overlapping with the second electrode when projected to the plane is in the first state.

20. A method for manufacturing an organic electroluminescent device comprising:
preparing a workpiece including a first electrode having a first major surface and a second major surface opposite to the first major surface and being light transmissive, a second electrode facing a portion of the first major surface, and an organic light emitting layer provided between the first electrode and the second electrode; and
forming an optical layer on a surface of the workpiece on a side of the second major surface, the optical layer being able to transit between a first state where a traveling direction of light emitted from the organic light emitting layer is changed and a second state having a smaller degree of the change in the traveling direction of the light than the first state.

* * * * *